United States Patent
Kim et al.

(10) Patent No.: US 6,586,863 B2
(45) Date of Patent: Jul. 1, 2003

(54) ROSEN TYPE PIEZOELECTRIC TRANSFORMER WITH MULTIPLE OUTPUT ELECTRODES

(75) Inventors: Jong-Sun Kim, Kyungki-do (KR); Jang-Hyoun Youm, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 09/894,452

(22) Filed: Jun. 28, 2001

(65) Prior Publication Data

US 2003/0001461 A1 Jan. 2, 2003

(51) Int. Cl.⁷ .................... H01L 41/07; H01L 41/083
(52) U.S. Cl. .................................. 310/359; 310/366
(58) Field of Search .......................... 310/358, 359, 310/365, 366, 319

(56) References Cited

U.S. PATENT DOCUMENTS

| | | | | |
|---|---|---|---|---|
| 5,751,092 A | * | 5/1998 | Abe | 310/359 |
| 5,892,318 A | | 4/1999 | Dai et al. | 310/358 |
| 5,929,554 A | * | 7/1999 | Kanayama et al. | 310/359 |
| 5,962,954 A | * | 10/1999 | Leers et al. | 310/359 |
| 6,188,163 B1 | * | 2/2001 | Danov | 310/366 |
| 6,278,226 B1 | * | 8/2001 | Danov et al. | 310/359 |
| 6,362,560 B1 | * | 3/2002 | Yang et al. | 310/359 |

* cited by examiner

*Primary Examiner*—Michael C. Zarroli
(74) *Attorney, Agent, or Firm*—Renner, Otto, Boisselle & Sklar, LLP (57) ABSTRACT

A piezoelectric transformer with multiple outputs and a stabilizer having the piezoelectric transformer with multiple output electrodes is disclosed. The piezoelectric transformer with multiple outputs lights a plurality of cold cathode fluorescent lamps at the same time by forming a plurality of output electrodes as one body. The piezoelectric transformer includes a piezoelectric plate; an input electrode formed on an upper surface of the plate; a plurality of output electrodes having an identical band shape, arranged in equal distance in the longitudinal direction of the plate at an outer side of the input electrode, and connected electrically to one ends of the plurality of the cold cathode fluorescent lamps respectively; and a common electrode formed on a bottom surface of the plate, confronting to the input electrode, commonly connected to ground of the stabilizer and other ends of the plurality of the cold cathode fluorescent lamps.

4 Claims, 9 Drawing Sheets

ROSEN TYPE PIEZOELECTRIC TRANSFORMER WITH MULTIPLE OUTPUT ELECTRODES

BACKGROUND OF THE INVENTION

1. Field of the Invention

The present invention relates to a Rosen type piezoelectric transformer constituting a stabilizer for cold cathode fluorescent lamps used for a back light of a liquid crystal display (LCD) device. More particularly, the present invention relates to a Rosen type piezoelectric transformer with multiple output electrodes for lighting a plurality of cold cathode fluorescent lamps at the same time by forming multiple output electrodes as one body, and a stabilizer for multiple light sources using such Rosen type piezoelectric transformer.

2. Description of the Prior Art

As is well known to those skilled in the art, a fluorescent lamp needs high voltage at initial lighting in order to emit the required thermal electrons for an electric discharge. After electric discharge, the voltage impressed on the fluorescent lamp has negative resistance characteristics reduced when the lamp current increases.

Especially, a cold cathode fluorescent lamp that is used for a backlight of a liquid crystal display (LCD) device is a light source using cold emission (electron emission caused by forcing a strong electric field to a cathode surface). In order to light the backlight comprised of the cold cathode fluorescent lamp, about 500 V is needed. Generally, a step-up transformer is used to convert a commercial AC power source into the driving voltage.

Figure 7:
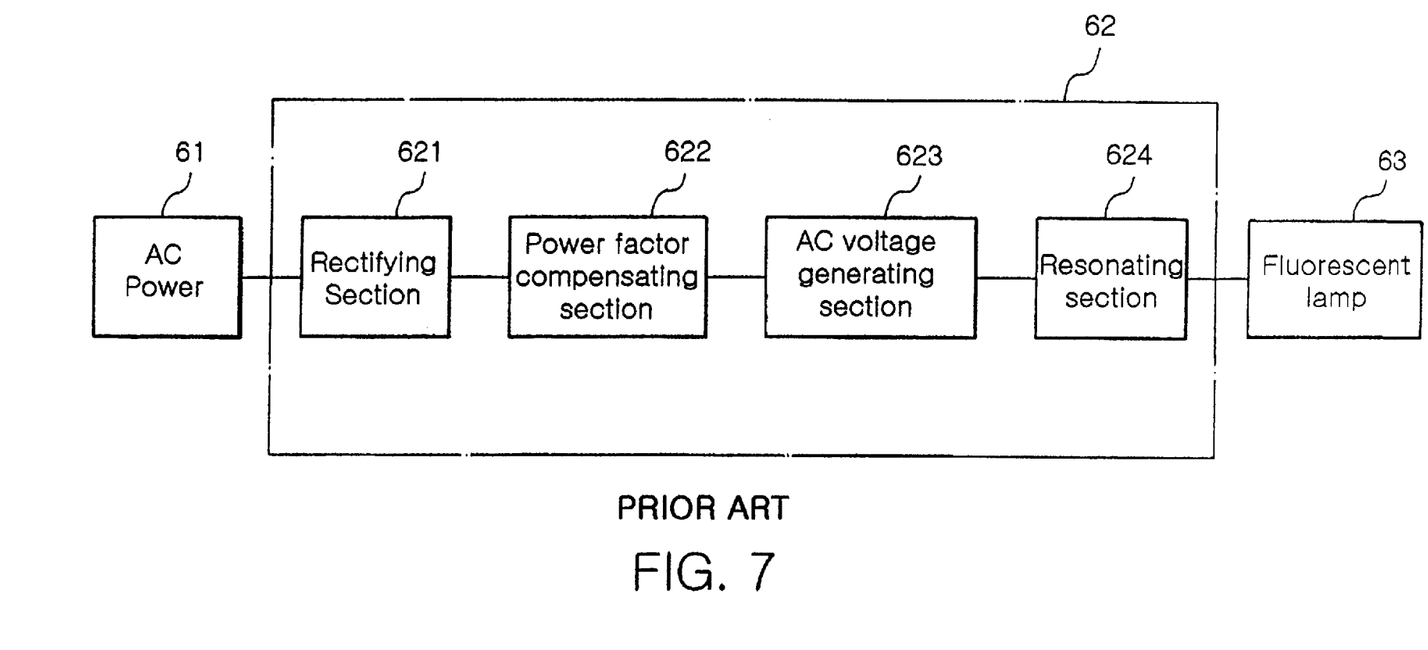
FIG. 7 shows a block diagram of a conventional fluorescent lamp stabilizer.

The stabilizer is a lamp lighting device that applies the driving voltage for lighting the fluorescent lamp with the above mentioned properties, and comprises, as shown in FIG. 7, a rectifying section 621 which rectifies an AC commercial source 61 to DC voltage in some level, a power factor compensation section 622 for compensating the power factor caused by the fluctuation of the AC commercial voltage source in respect of the output voltage of the rectifying section 621, an AC voltage generating section 623 for converting the DC voltage inputted through the power factor compensation section 622 into a proposed AC voltage of high frequency, and a resonating section 624 for resonating with the output voltage of the AC voltage generating section 623 and supplying the AC voltage to the fluorescent lamp 63.

As above-mentioned, the AC voltage generating section 623 is called an inverter.

The resonating section 624 is conventionally constructed to generate the resonance by the inductance of a winding type transformer and the capacitance of a resonance capacitor in connection with the winding type transformer. But the winding type transformer has some problems in that it produces a high rate of poor quality and the credibility of the stabilizer is reduced because the deviation of the quality of core is excessive. For this reason, the winding type transformer has recently been replaced with a piezoelectric transformer such that the resonance is generated by the inductance of the inductor with the capacitance of the piezoelectric transformer.

But the above statement is the case of connecting one fluorescent lamp to one stabilizer. On the other hand, in a case of lighting more than two fluorescent amps by connecting the fluorescent lamps into one stabilizer, if one of numerous fluorescent lamps is lighted, other fluorescent lamps connected to the wound-type transformer in parallel are not lighted because a lower voltage is supplied to the other fluorescent lamps by lighting the one fluorescent lamp.

Figure 8:
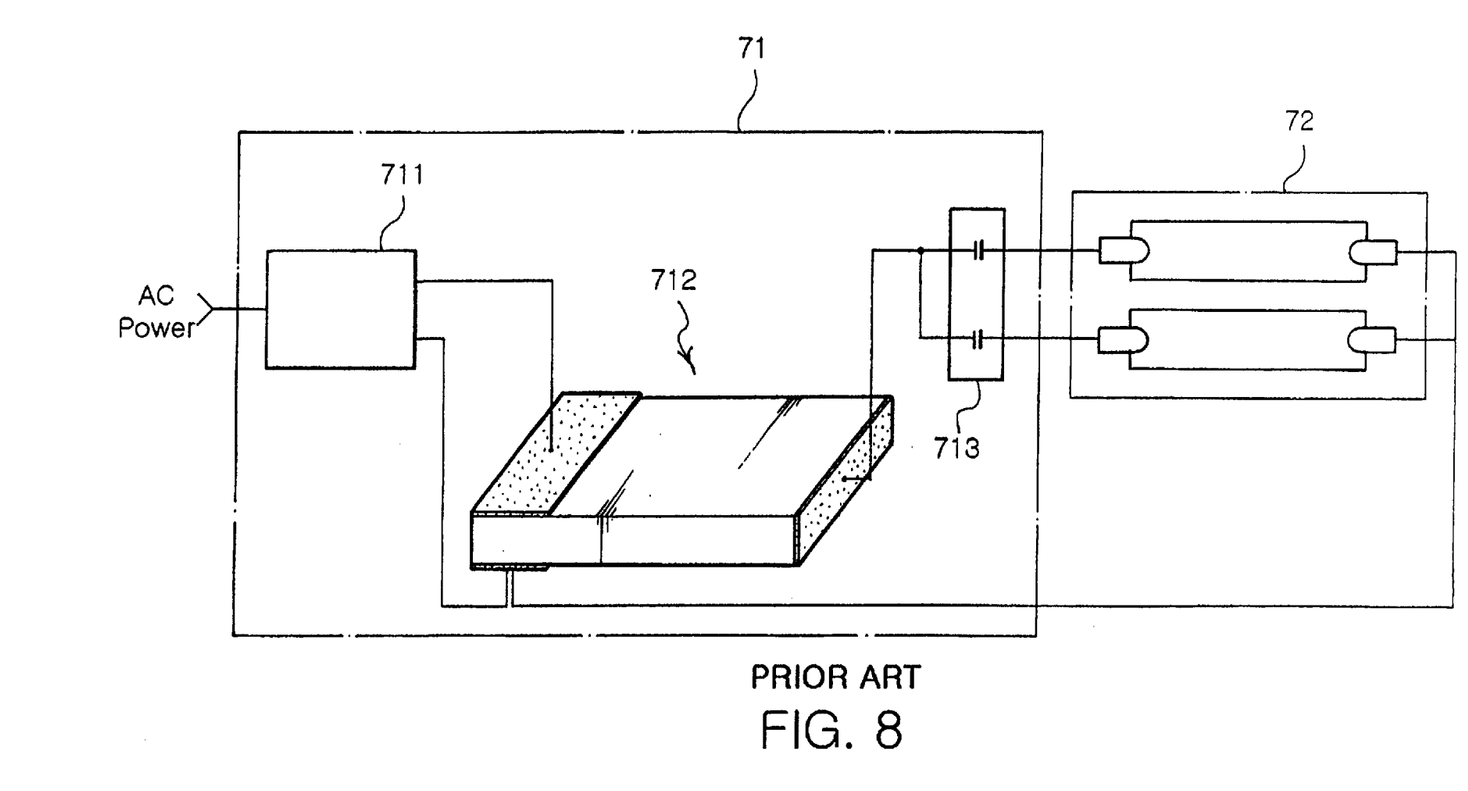
FIG. 8 shows a perspective view of a stabilizer for a plurality of lamps applying a conventional winding type transformer.
Figure 9:
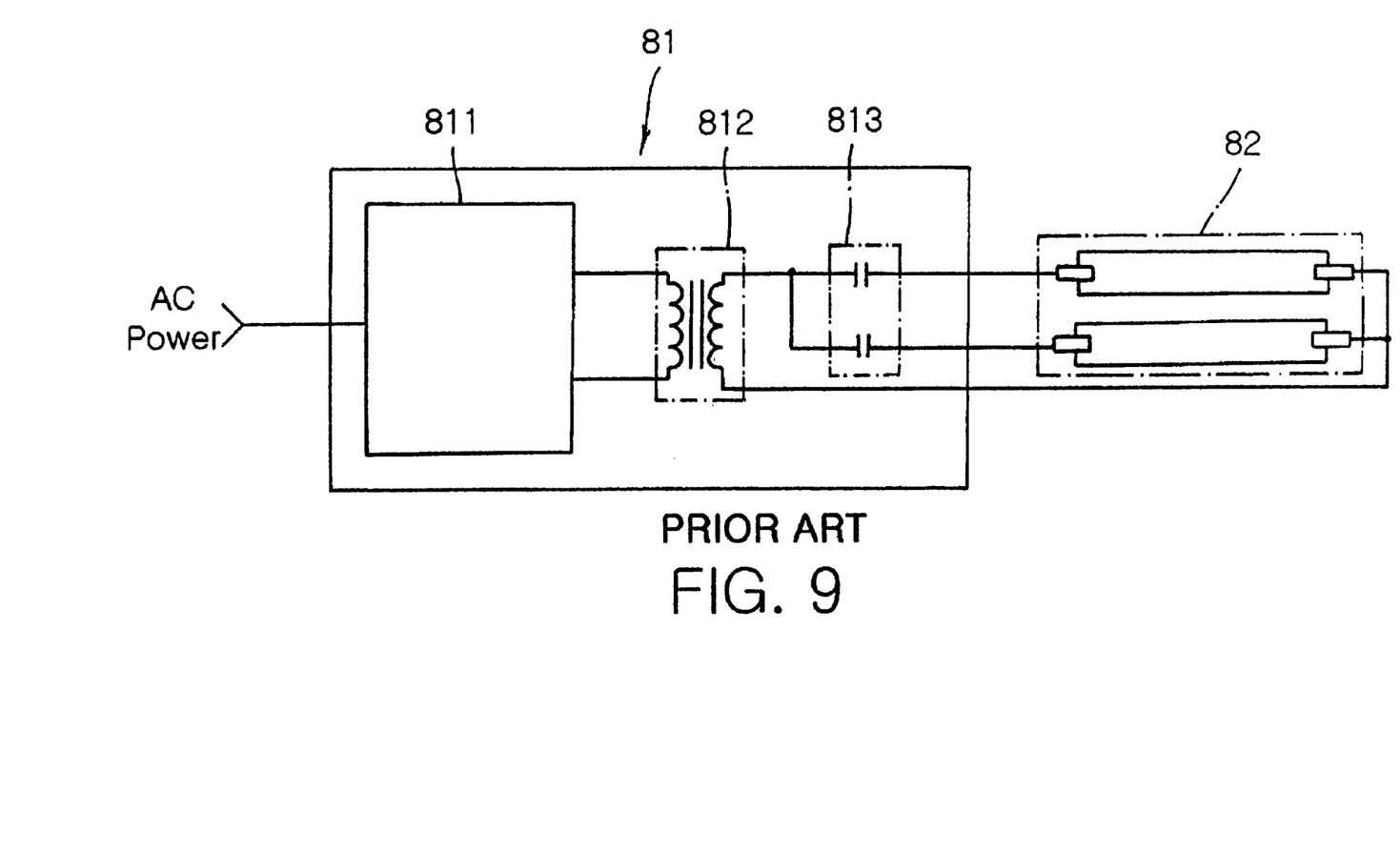
FIG. 9 shows a perspective view of a stabilizer for a plurality of lamps applying a conventional piezoelectric transformer.

Accordingly, in the case of connecting two or more fluorescent lamps to one stabilizer, as shown in FIGS. 8 and 9, the ballast capacitor is directly connected between fluorescent lamps 72, 82 and transformers 712, 812 such that the voltage required for initial lighting is impressed on the fluorescent lamps 72, 82 even if a certain fluorescent lamp is lighted ahead of the fluorescent lamps 72, 82.

Hence, the conventional stabilizer used for a plurality of light sources is constructed as shown in FIGS. 8 and 9.

As is shown in FIG. 8, the stabilizer 71, for a plurality of fluorescent lamps having a wound-type transformer, comprises a circuit section 711, which includes the rectifying section 621, the power compensating section 622, the AC voltage generating section 623, and the resonance capacitor of the resonating section 624, the wound-type transformer 712, the input electrode of which is connected to the resonance capacitor of the circuit section 711, and a plurality of ballast capacitors 713 that are connected to an output electrode of the wound-type transformer 712 in parallel. The number of ballast capacitors is the same as the number of lamps. Furthermore, a plurality of fluorescent lamps 72 is connected to the other terminal of the plurality of ballast capacitors 713 of the stabilizer 71, respectively.

As is shown in FIG. 9, the stabilizer 81 for a plurality of fluorescent lamps having a piezoelectric transformer comprises a circuit section 811, which includes the rectifying section 621, the power compensating section 622, the AC voltage generating section 623, and the resonance capacitor of the resonating section 624, the piezoelectric transformer 812, the input electrode of which is connected to a resonance capacitor of the circuit section 811, and a plurality of ballast capacitors 813 that are connected to an output electrode of the piezoelectric transformer 812 in parallel. Furthermore, the plurality of fluorescent lamps 82 is connected to the other terminal of the plurality of ballast capacitors 813 of the stabilizer 81, respectively.

In the stabilizer above, because AC voltage supplied by the wound-type transformer 712 or the piezoelectric transformer 812 is divided equally among the plurality of fluorescent lamps via the ballast capacitor 713,813, the plurality of fluorescent lamps can be lighted at the same time. The ballast capacitor 713,813 has a high withstand voltage characteristic, and its size is also big.

Accordingly, as is shown in FIG. 8 or FIG. 9, because the stabilizer needs the ballast capacitors in proportion to the number of the connected fluorescent lamps, the volume and the number of components increase, and the cost increases also.

Thus, in the case of constituting a stabilizer as mentioned above, there have been some problems in that the number of components and the volume increases and the production costs rise because the number of ballast capacitors required is proportionate to the number of connected fluorescent lamps.

SUMMARY OF THE INVENTION

Accordingly, an object of the present invention is to provide a Rosen type piezoelectric transformer having a plurality of output electrodes with uniform output properties which make the fluorescent lamp light stably, the operation be simple, and the cost be reduced.

The present invention provides a Rosen type piezoelectric transformer with multiple output electrodes, being used for a stabilizer to light a plurality of cold cathode fluorescent lamps, comprising: a piezoelectric plate; an input electrode formed at an upper surface of the plate; a plurality of output electrodes having an identical band shape, arranged in equal distance in the longitudinal direction of the plate at an outer side of the input electrode, and connected electrically to one ends of the plurality of the cold cathode fluorescent lamps, respectively; and a common electrode formed at a bottom surface of the plate, confronting to the input electrode, commonly connected to ground of the stabilizer and the other ends of the plurality of the cold cathode fluorescent lamps.

BRIEF DESCRIPTION OF THE DRAWINGS

The above and other objects, features and other advantages of the present invention will be more clearly understood from the following detailed description taken in conjunction with the accompanying drawings, in which:

FIG. 5 shows a perspective view of a Rosen type piezoelectric transformer in accordance with another embodiment of the present invention and a stabilizer for a plurality of lamps applying that;

DETAILED DESCRIPTION OF THE INVENTION

Reference now should be made to the drawings, in which the same reference numerals are used throughout the different drawings to designate the same or similar components.

Figure 1:
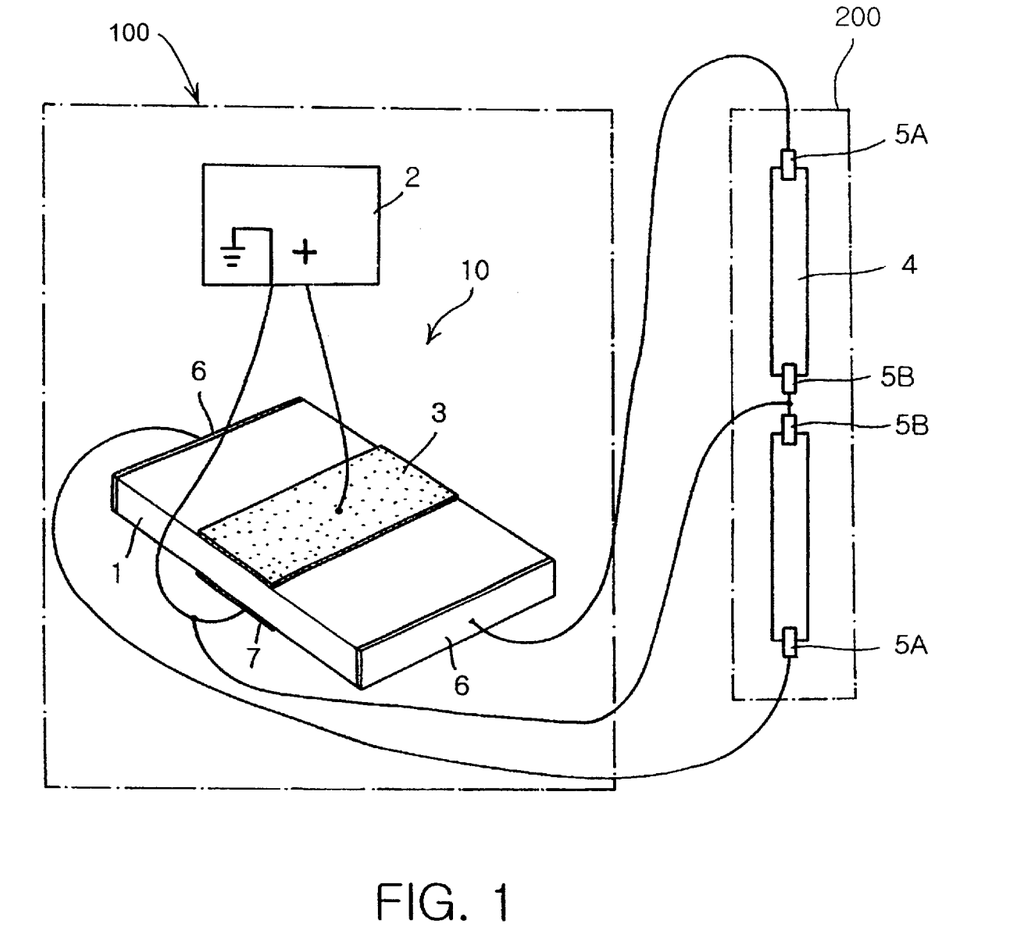
FIG. 1 shows a perspective view of a stabilizer for a plurality of lamps having a Rosen type piezoelectric transformer in accordance with the primary embodiment of the present invention.

FIG. 1 shows a view of an embodiment of a piezoelectric transformer 10 and a stabilizer 100 using the piezoelectric transformer 10. In this embodiment, two light sources are used.

As is shown in FIG. 1, a Rozen type piezoelectric transformer 10 comprises an input electrode 3 formed at the center of the upper surface of the piezoelectric plate 1 in the longitudinal direction of the plate and connected to a circuit section 2 of a stabilizer 100, a common electrode 7 formed on the bottom surface of the piezoelectric plate 1 opposed to the input electrode 3, and two output electrodes 6 formed on both confronting side surfaces in the longitudinal direction of the plate 1.

The input electrode 3 and the common electrode 7 are connected to an output of the circuit section 2 in the stabilizer 100, the two output electrodes 6 are respectively connected to one end 5A of two cold cathode fluorescent lamps 4 of a lamp section 200, and the other end 5B of the two cold cathode fluorescent lamps 4 are connected to the common electrode 7. That is, two cold cathode fluorescent lamps 4 are connected to the piezoelectric transformer 10 in parallel.

As described above, the circuit section 2 converts the commercial voltage source of 220 V or 110 V with AC voltage of a predetermined voltage level and frequency. Then, the AC voltage is impressed to the input electrode 3 and the common electrode 7, resulting in a longitudinal vibration. The longitudinal vibration is transmitted to the output electrodes 6, and then an AC voltage outputs between the output electrodes 6 and the common electrode 7. The AC voltage outputted between the output electrodes 6 and the common electrode 7 is related to the distance to the input electrode 3 and the thickness of the piezoelectric plate 1, and the output electrodes 6 placed on the confronting side surface have the same output property because each of the output electrodes 6 has the same condition. Thus, an uniform voltage is impressed to the two cold cathode fluorescent lamps 4 such that all of the fluorescent lamps 4 can be lighted.

Figure 2:
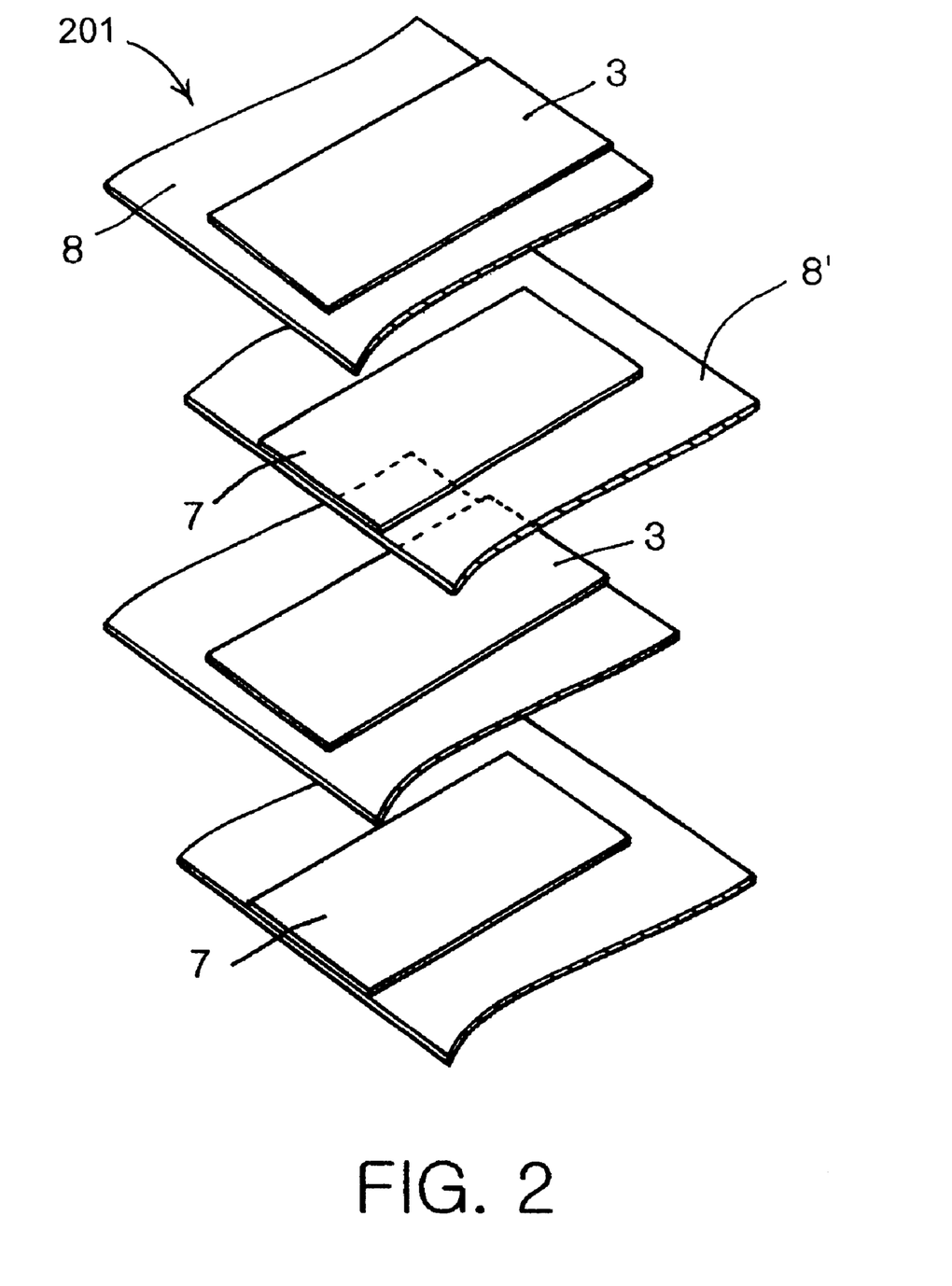
FIG. 2 shows a perspective view of the piezoelectric transformer in accordance with the present invention in FIG. 1.

FIG. 2 shows a perspective view of a piezoelectric transformer 201 that is a modification of the piezoelectric transformer 10 embodiment shown in FIG. 1. The piezoelectric transformer 201 is made by multi-layering a first piezo-sheet 8 printing the input electrode 3 on the surface thereof and a second piezo-sheet 8' printing the common electrode 7 on the surface thereof in turns. The input electrodes 3 on the first piezo-sheets are connected to each other and the common electrodes 7 on the second piezo-sheets 8' are connected to each other.

Figure 3:
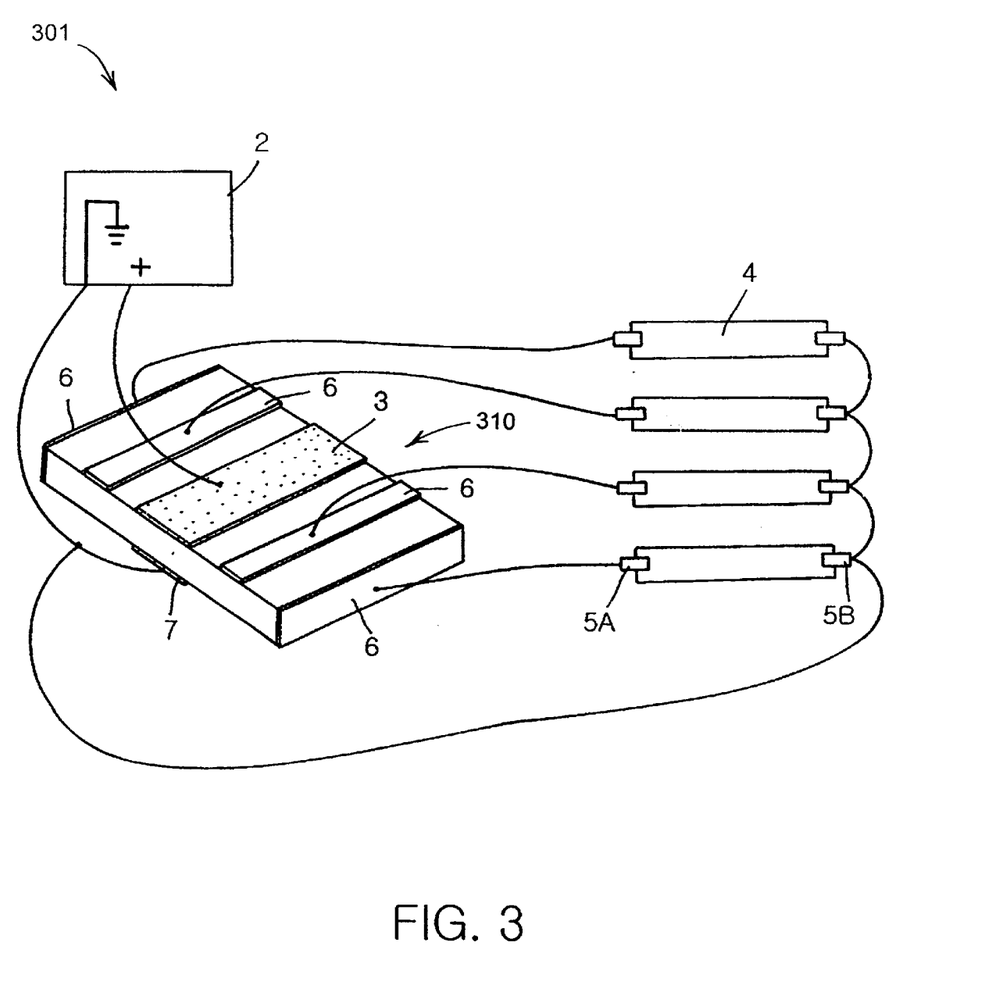
FIG. 3 shows a perspective view of a Rosen type piezoelectric transformer in accordance with another embodiment of the present invention and a stabilizer for lighting four lamps.
Figure 4:
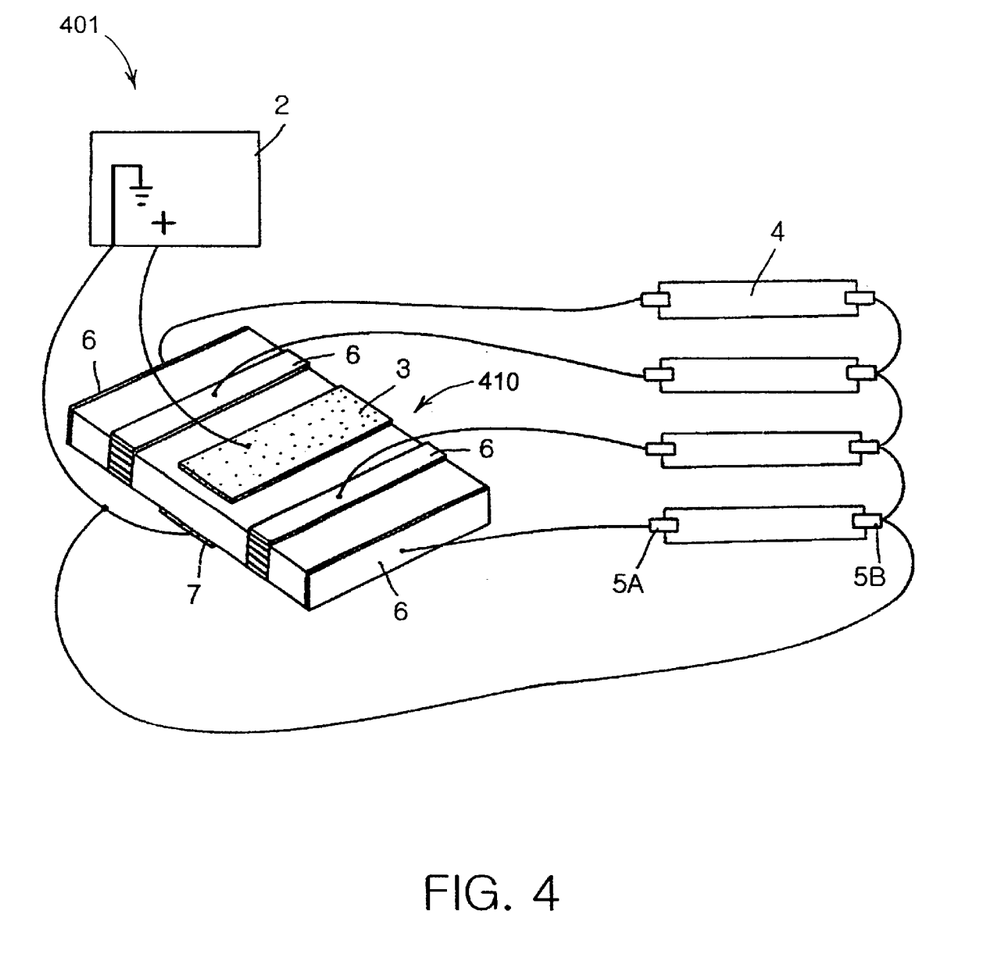
FIG. 4 shows a perspective view of the modified piezoelectric transformer as shown in FIG. 3.

FIGS. 3 and 4 show perspective views of respective embodiments of a piezoelectric transformer 310, 410 in accordance with an embodiment of the present invention, and a stabilizer 301, 401 applying the piezoelectric transformer 310, 410 to four light sources 4.

As shown in the drawings, the piezoelectric transformer 310, 410 has an input electrode 3 formed at the center of the upper surface of the piezoelectric plate 1 in the longitudinal direction of the plate.

In multi-layer type, the input electrode 3 and the output electrodes 6 are formed on the surface of a piezo-sheet. The input electrode 3 is connected to the circuit section 2.

Four output electrodes 6 are formed in positions divided into equal distance on the upper surface and both confronting side surfaces in the longitudinal direction. The common electrode 7 is formed on the bottom surface of the piezoelectric plate 1 opposed to the input electrode 3.

The input electrode 3 is connected to the output of generating AC voltage of the circuit section 2. The four output electrodes 6 are connected to the one ends 5A of the cold cathode fluorescent lamps 4. The other ends 5B of the cold cathode fluorescent lamps 4 and the ground of the circuit section 2 are connected to the common electrode 7.

Figure 5:
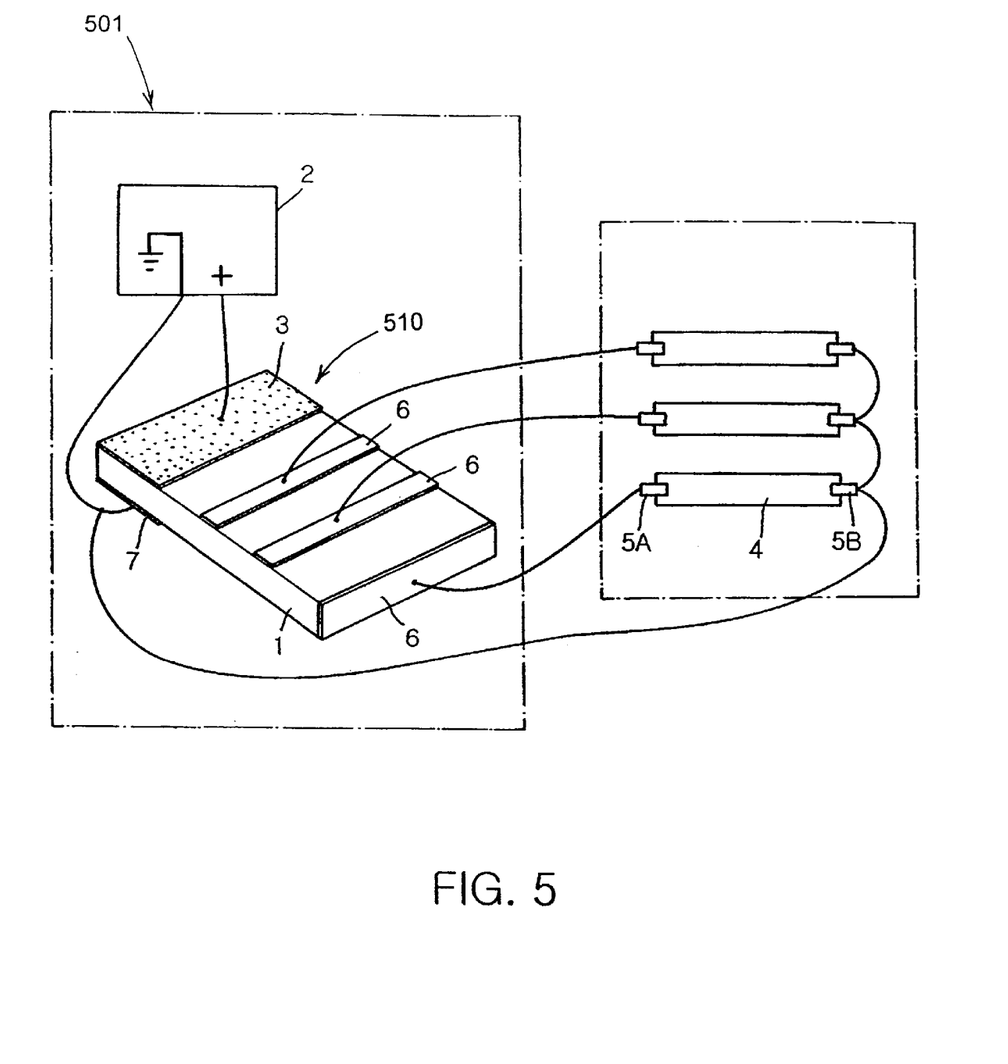
Figure 6:
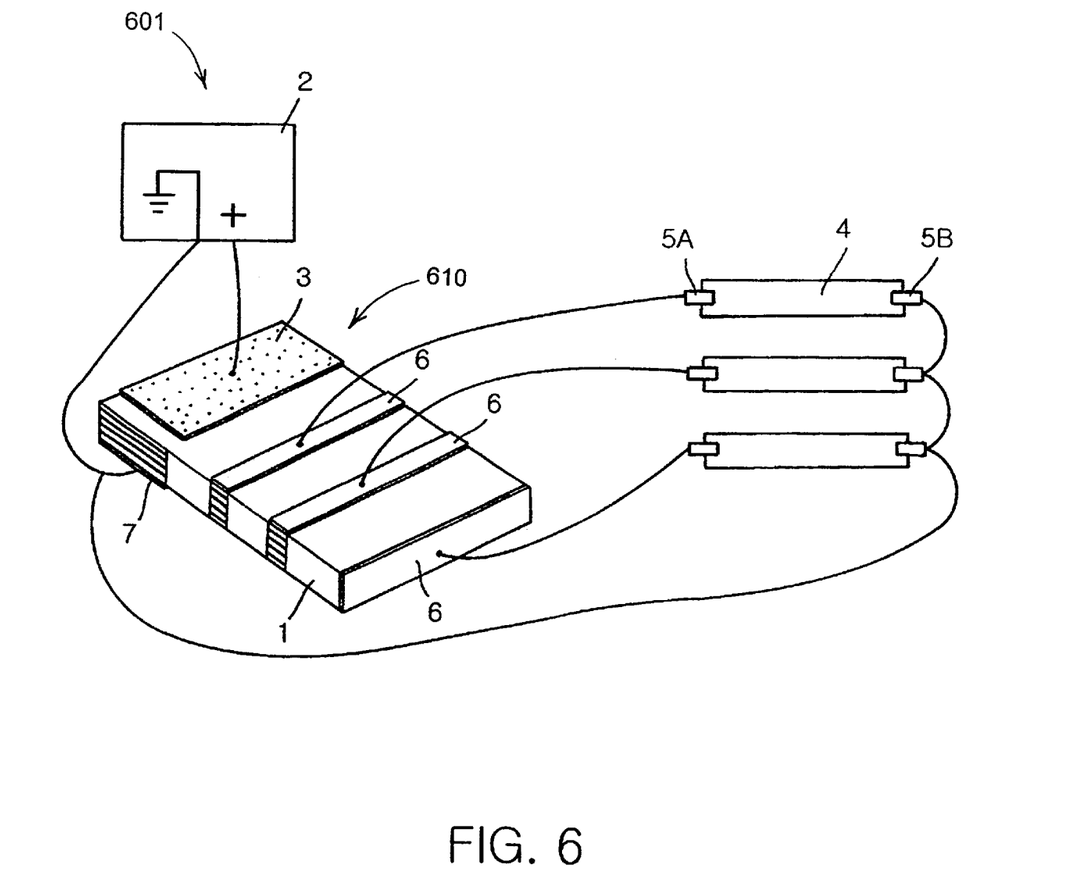
FIG. 6 shows a perspective view of the modified piezoelectric transformer as shown in FIG. 5.

Additionally, FIGS. 5 and 6 show perspective views of respective embodiments of a piezoelectric transformer 510, 610 in accordance with another embodiment of the present invention, and a stabilizer 501, 601 applying the piezoelectric transformer 510, 610 to three light sources 4. In FIG. 5, an input electrode 3 is formed at one end of the upper surface of the plate 1 in the longitudinal direction of the piezoelectric plate 1, and connected to the circuit section 2. An output electrode 6 is formed on a side surface of the piezoelectric plate 1 in a direction of the thickness of the plate, and a pair of output electrodes 6 are formed on an upper surface of the plate 1 in a band shape, being arranged in an equal distance. The common electrode 7 is formed on the bottom surface of the piezoelectric plate 1 opposed to the input electrode 3 and is connected to the AC voltage generator 2 and the other ends 5B of the plurality of the cold cathode fluorescent lamps 4 at the same time.

In FIG. 6, the input electrode 3 is connected to the circuit section 2 and the output electrodes 6 are formed on the surface of a piezo-sheet, and the common electrode 7 is formed on the surface of another piezo-sheet. The piezo-sheet on which the input electrode 3 and output electrodes 6 are formed, and the other piezo-sheet on which the common electrode 7 is formed, are layered in turns.

The operational effect of the present invention will be described herein below.

In order to satisfy restricting the noise, lowering the spending power, making the device miniaturization, and the like, a piezoelectric transformer having the piezoelectric effect is used.

The basic principle of the piezoelectric transformer is the following. A deformation of another section of the piezoelectric transformer is generated due to a deformation generated by impressing a voltage to one section of the piezoelectric transformer, and a second voltage is then generated on another section. The principle above is applied to the Rosen type, which is the simplest type.

A piezoelectric plate is formed by stacking a plurality of sheets to which internal electrodes are printed in some patterns and stacked, an external input electrode is formed on one longitudinal side of the upper and bottom surface of the piezoelectric plate, and an output electrode is formed at a confronting position of the input section on the side of the piezoelectric plate.

If the voltage having resonance frequency is impressed to the external output electrode, a longitudinal vibration mode is generated in the internal electrode, and the longitudinal vibration is generated in the output electrode formed on the side surface of the piezoelectric plate by the generated longitudinal vibration mode, and the voltage is generated in the output electrode as a piezoelectric effect occurred by the produced stress. Then, the voltages of the output terminal rise.

As shown in FIGS. 1 and 2, the input electrode 3 and the common electrode 7 formed on the upper and bottom surface of the piezoelectric plate 1 are connected to the AC voltage generator 2. If a voltage having a resonance frequency from the AC voltage generator 2 is supplied to the input electrode 3 and the common electrode 7, the output electrode 6 formed on both sides of the piezoelectric plate 1 vibrates and the vibration is generated in a direction of length by longitudinal vibration mode.

A voltage is applied to the output electrode 6 by the piezoelectric effect produced by the stress of the piezoelectric plate 1, and a high voltage is impressed on the cold cathode fluorescent lamp 4 connected through the terminal 5A.

The same voltage is impressed through the common electrode 7 placed in the bottom surface of the piezoelectric plate 1, which is formed at the confronting position of the input electrode 3, and the common electrode 7 is connected to the AC voltage generator 2 and the other terminals 5B of a plurality of the cold cathode fluorescent lamps 4 such that the cold cathode lamp 4 is impressed with a high voltage.

In addition, as shown in FIGS. 3 and 4, the resonance frequency is impressed by means of inputting the input electrode 3 and the common electrode 7 placed in the upper and bottom surface of the piezoelectric plate 1 or made from stacking into the AC voltage generator 2. Then, the longitudinal vibration mode occurs in the internal section, and this makes the longitudinal vibration in the direction of length of the multiple output electrodes 6 placed on both surfaces of the piezoelectric plate 1 and the surface of the input electrode 3.

A voltage is applied to the output electrode 6 by the piezoelectric effect produced by the stress, and boosting is produced to impress high voltage on the cold cathode fluorescent lamps 4 connected through the terminal 5A.

The same voltage is impressed through the common electrode 7 placed on the bottom surface of the piezoelectric plate 1, which is formed at the confronting position of the input electrode 3, and the common electrode 7 is connected to the AC voltage generator 2 and the other terminals 5B of a plurality of the cold cathode fluorescent lamps 4 such that the cold cathode lamp 4 is impressed with a high voltage.

Accordingly, it is possible to reduce the number of the components and minimize the size of the inverter by using the piezoelectric transformer with multiple outputs in accordance with the present invention. This removes the retraction of designing and the needs of installation of a high internal voltage condenser. Also, additional grounding equipment is unnecessary.

Accordingly, it is possible to generate a multiple output voltage having an uniform output property by using the multiple output electrodes. Thus, by providing a cold cathode fluorescent lamp using the piezoelectric transformer with multiple outputs, an easy working and a cost savings may be realized without an additional ballast capacitor.

Finally, by minimizing the volume of the stabilizer, a design restriction of the stabilizer may be lower, and it is not necessary to design about the isolation additionally.

In addition, multiple outputs are easily obtained by applying the piezoelectric transformer of the present invention and various vibration modes (including length type, width type, area type, radial type, ring type vibration mode, and the like) to a power converting circuit (for example, DC-DC converter, AC-DC converter, DC-AC converter) transmitting a power.

Although various embodiments of this invention have been shown and described, it should be understood that variations, modifications and substitutions, as well as rearrangements and combinations of the preceding embodiments can be made by those skilled in the art without departing from the novel spirit and scope of this invention.

What is claimed is:

1. A Rosen type piezoelectric transformer being used for a stabilizer to light a plurality of cold cathode fluorescent lamps, comprising:

a piezoelectric plate having confronting side surfaces;

an input electrode formed on an upper surface of the piezoelectric plate in the longitudinal direction of the piezoelectric plate;

two first output electrodes formed on the confronting side surfaces in the longitudinal direction of the piezoelectric plate;

a common electrode formed on a bottom surface of the piezoelectric plate, confronting to the input electrode; and a plurality of second output electrodes on the upper surface of the plate, wherein the distances between the neighboring second output electrodes being identical each other.

2. A Rosen type piezoelectric transformer being used for a stabilizer to light a plurality of cold cathode fluorescent lamps, comprising:

- a piezoelectric plate including alternately laminated first piezo-sheets and second piezo-sheets, the piezoelectric plate having confronting side surfaces;
- a plurality of input electrodes formed at the center of the first piezo-sheets in the longitudinal direction of the first piezo-sheets;
- two first output electrodes formed on the confronting side surfaces in the longitudinal direction of the piezoelectric plate;
- a plurality of common electrodes formed on the second piezo-sheets, confronting to the respective input electrodes; and
- a plurality of second output electrodes formed between the input electrodes and the first output electrodes on the first piezo-sheets respectively, wherein the distances between the neighboring second output electrodes being identical to each other.

3. A Rosen type piezoelectric transformer being used for a stabilizer to light a plurality of cold cathode fluorescent lamps, comprising:

- a piezoelectric plate having an upper surface including first and second longitudinally spaced ends;
- an input electrode formed on the first end of the upper surface of the piezoelectric plate in the longitudinal direction of the plate;
- a first output electrode formed on a side surface of the piezoelectric plate, adjacent to the second end of the upper surface of the piezoelectric plate;
- at least one second output electrode formed in a band shape between the input electrode and the first output electrode, wherein the distances between neighboring second output electrodes being identical to each other; and
- a common electrode formed on a bottom surface of the piezoelectric plate, confronting to the input electrode.

4. A Rosen type piezoelectric transformer being used for a stabilizer to light a plurality of cold cathode fluorescent lamps, comprising:

- a piezoelectric plate including alternately laminated first piezo-sheets and second-piezo sheets;
- a plurality of input electrodes formed on one end of the first piezo-sheets in the longitudinal direction of the first piezo-sheets;
- a first output electrode formed on a side surface of the piezoelectric plate;
- a plurality of second output electrodes formed between the input electrode and the first output electrode on the first piezo-sheets respectively, wherein the distances between neighboring second output electrodes being identical to each other; and
- a plurality of common electrodes formed on the second piezo-sheets, confronting to the input electrode.

* * * * *